United States Patent [19]

Shirai et al.

[11] Patent Number: 4,672,740
[45] Date of Patent: Jun. 16, 1987

[54] BEAM ANNEALED SILICIDE FILM ON SEMICONDUCTOR SUBSTRATE

[75] Inventors: Kazunari Shirai, Yokohama; Hajime Kamioka, Mizusawa; Shigeyoshi Koike, Kawasaki, all of Japan

[73] Assignee: Fujitsu Limited, Kawasaki, Japan

[21] Appl. No.: 644,962

[22] Filed: Aug. 28, 1984

[30] Foreign Application Priority Data

Aug. 31, 1983 [JP] Japan ................... 58-159536

[51] Int. Cl.⁴ .................... H01L 21/44; H01L 21/441
[52] U.S. Cl. ............................ 29/590; 148/DIG. 19; 148/DIG. 90; 427/93
[58] Field of Search ............... 29/571, 576 B, 589, 29/590; 148/1.5, DIG. 3, DIG. 19, DIG. 90, DIG. 93, DIG. 91, 147; 357/67 S, 71 S; 427/93, 95

[56] References Cited

U.S. PATENT DOCUMENTS

| | | | |
|---|---|---|---|
| 4,141,022 | 2/1979 | Sigg et al. | 357/715 |
| 4,385,433 | 5/1983 | Ozawa | 29/576 B |
| 4,392,299 | 7/1983 | Shaw | 29/590 |
| 4,485,550 | 12/1984 | Koeneke et al. | 29/571 |
| 4,505,027 | 3/1985 | Schwabe et al. | 29/577 C |
| 4,510,670 | 4/1985 | Schwabe et al. | 29/571 |
| 4,551,907 | 11/1985 | Mukai | 29/571 |
| 4,569,122 | 2/1986 | Chan | 29/577 C |
| 4,577,396 | 3/1986 | Yamamoto et al. | 29/576 B |

FOREIGN PATENT DOCUMENTS

| | | |
|---|---|---|
| 0054259 | 6/1982 | European Pat. Off. . |
| 0068897 | 1/1983 | European Pat. Off. . |
| 0071029 | 2/1983 | European Pat. Off. . |
| 63819 | 5/1980 | Japan .................. 148/DIG. 93 |
| 95824 | 6/1983 | Japan .................. 29/589 |
| 61145 | 4/1984 | Japan .................. 29/589 |

OTHER PUBLICATIONS

Poate et al, "Laser Induced Reaction of Metal Films with Silicon" MRS Boc. Boston 78.
Murarka, "Refractory Silicides for Integrated Circuits", J. Vac. Sci. Technol., 17(4) Jul./Aug. 1980.
Murarka et al, "Silicide Formation in their cosputtered (titanium+silicon) Films on Polycrystalline Silicon and $SiO_2$,", J. Appl. Phys. 51(1) 1/80.
Brown, "Unique Semiconductor Materials and Structures Produced by Laser and Electron Beams", J. Vac. Sci. Technol., 20(3) 3/82.
Extended Abstracts, vol. 81-1, May 1981, Pennington, USA; P. Murarka "Siliides: Which, Why and How?", abstract No. 225, pp. 564-566.
European Search Report, Berlin, 11/28/84, Rother, A. H. J.

Primary Examiner—Olik Chaudhuri
Attorney, Agent, or Firm—Staas & Halsey

[57] ABSTRACT

A semiconductor device having contact windows between an aluminum or aluminum-alloy wiring layer and a diffused region in a semiconductor substrate, in which the contacts are formed by using a barrier film on a refractory metal silicide between the wiring layer and the diffused region. The barrier film comprising the refactory metal and silicon is beam annealed for a short period of time such as, 10 seconds or less, so that adverse effects of the barrier film can be prevented while an excellent electrical or ohmic contact between the wiring layer and the diffused layer can be obtained.

24 Claims, 10 Drawing Figures

BEAM ANNEALED SILICIDE FILM ON SEMICONDUCTOR SUBSTRATE

BACKGROUND OF THE INVENTION

1. Field of the Invention

The present invention relates to a process for fabricating a semiconductor device. More specifically, the present invention relates to an electrical or ohmic contact of an aluminum or aluminum-alloy wiring layer with a semiconductor substrate such as silicon, using a refractory metal silicide film as a barrier film between the wiring layer and the substrate.

2. Description of the Related Art

Aluminum or an aluminum-alloy such as aluminum-silicon is widely used as a wiring material in integrated circuits. These materials have the characteristics of low resistivity and good adherence to silicon or silicon oxide and are capable of forming ohmic contact with p-type and n-type doped layers. It is well known, however, that when heat treatment is carried out during the semiconductor device fabrication process, aluminum is dissolved into the silicon substrate, forming vertical aluminum-rich spikes passing through a pn-junction in the silicon substrate, and causing junction leakage or other defects. This problem becomes more serious when a dopant-diffused region is made shallower and narrower in order to increase the density of the integrated circuits.

To alleviate the above-described problem, aluminum-silicon alloy, typically 1%-silicon aluminum-alloy, is used as the wiring material in integrated circuits. However, when heat treatment is carried out during the fabrication process, the silicon in an aluminum-silicon alloy wiring layer is deposited onto the surface of a silicon substrate by solid phase epitaxy. This deposition may cause contact failure or breaks in the wiring. This silicon deposition has a p-type conductivity due to the aluminum content and, therefore, contact failure occurs easily when the substrate has an n-type conductivity. Further, the problem caused by this deposition becomes more serious when the size of a contact window between the wiring and the substrate is made smaller, in particular, smaller than a square measuring 2 $\mu$m$\times$2 $\mu$m, in order to increase the density of the integrated circuits.

A barrier film can be inserted between an aluminum or aluminum-alloy wiring layer and a silicon semiconductor substrate in a contact region, to avoid the above-described problems of the aluminum and aluminum-silicon-alloy wiring layers, and silicides of refractory metals, typically, molybdenum silicide (MoSi$_2$), are proposed to be used for such a barrier film.

However, in known methods for the deposition of silicide, such as co-sputtering, hotpress-target-sputtering, and the like, the refractory metal silicide layer as deposited is not well-formed. In experiments, the inventors found that, if an aluminum or aluminum-alloy wiring layer is formed onto a film made by depositing both a refractory metal such as molybdenum and silicon on a semiconductor substrate, without carrying out annealing of the film before forming the wiring layer, a silicon phase may appear in the aluminum or aluminum-alloy wiring layer formed on the barrier film when heat treatment is carried out during the fabrication process. If this silicon phase is formed in an aluminum or aluminum-alloy wiring layer, electromigration is accelerated in the wiring layer, resulting in wiring defects or breakage.

There has been proposed the annealing of a barrier film made by depositing both a refractory metal and silicon on a semiconductor substrate, the annealing being carried out in a furnace before forming an aluminum or aluminum-alloy wiring layer on the film, in order to fix the bonds between the refractory metal and the silicon, or to silicidate the refractory metal. For example, this furnace annealing for silicidating a barrier metal film comprising molybdenum and silicon is carried out at a temperature of 900° C. for 20 minutes in a nitrogen atmosphere in a diffusion furnace. It is known that, ideally, a temperature of 1050° C. is needed to ensure silicidation of molybdenum. However, if such a furnace annealing is carried out at a temperature of 900° C. to 1050° C., an excellent electrical or ohmic contact between the wiring layer and the semiconductor substrate is difficult to obtain, or is not stably obtained, resulting in defects occurring in the semiconductor devices.

SUMMARY OF THE INVENTION

An object of the present invention is to provide an aluminum or aluminum-alloy wiring layer on a semiconductor layer, with excellent electrical or ohmic contact therebetween and without the problems described above.

The above and other objects, features, and advantages of the present invention are attained by a process for fabricating a semiconductor device, the steps of the process including forming a contact window in an insulating layer on a semiconductor substrate and depositing a film comprising a refractory metal and silicon on the insulating layer and through the contact window on the semiconductor substrate. Beam annealing the film comprising the refractory metal and silicon is performed for a short period of time, to ensure silicidation of the film. An aluminum or aluminum-alloy layer is deposited onto the resultant film of the refractory metal to form an electrical or ohmic contact between the aluminum or aluminum-alloy layer and the semiconductor substrate through the contact window.

The inventors found that an excellent electrical or ohmic contact between an aluminum or aluminum-alloy wiring layer and a semiconductor substrate can be obtained even if the barrier film comprising a refractory metal and silicon is annealed and silicidated before forming the wiring layer, provided that the annealing is carried out by beam annealing for a short period of time, i.e., 60 seconds or less, usually 20 seconds or less, preferably 10 seconds or less, more preferably 5 seconds or less. Such beam annealing may be carried out by lamp annealing, e.g., halogen lamp annealing, laser annealing, or electron beam annealing. The annealing temperature is generally in the range of 750° C. to 1100° C., and is preferably in the range of 900° to 1050° C. for molybdenum silicide, tungsten silicide, or tantalum silicide, and from 800° C. to 1000° C. for titanium silicide.

The inventors have discovered that beam annealing for short periods of time will effectively silicidate the film without having an adverse effect on an electrical or ohmic contact between the wiring layer and the substrate, for the following reasons. In furnace annealing, a relatively long annealing time is necessary to ensure silicidation of the barrier film, which causes a high degree of rediffusion or dispersion of the dopants in a diffused region formed just under the barrier film in the contact window, with the result that the wiring layer formed on the barrier film cannot make an excellent electric or ohmic contact with the rediffused diffused region or the semiconductor substrate. In contrast, beam annealing such as halogen lamp annealing, in accordance with the present invention, can heat the barrier metal film to a desired temperature, and ensure silicidation of the film in a period of time far shorter than that needed for furnace annealing. This permits silicidation of the barrier film without substantial rediffusion of the dopants in the diffused region in the semiconductor substrate. Thus, an excellent electrical or ohmic contact is obtained between the wiring layer formed on the barrier metal film and the diffused region in the semiconductor substrate.

BRIEF DESCRIPTION OF THE DRAWINGS

The present invention is described below with reference to the drawings, in which.

DESCRIPTION OF THE PREFERRED EMBODIMENTS

Figure 1:
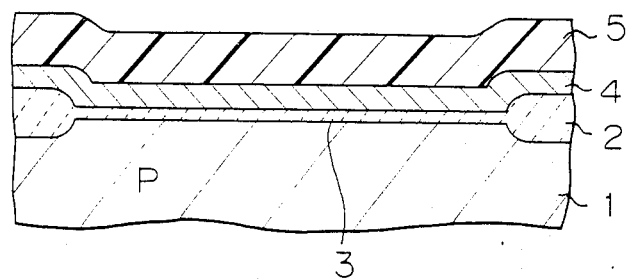
FIGS. 1 to 5 are sectional views of a main part of a semiconductor device showing various steps of a process for fabricating the device according to the present invention.

The present invention is described using a process for fabricating a MOS transistor device as an example. FIGS. 1 to 5 show the MOS transistor during various steps of the fabrication. Referring to FIG. 1, the surface of a p-type silicon single crystal substrate 1 is selectively oxidized to form field oxide layers 2 which are 800 nm thick. The exposed surface of the p-type silicon substrate 1 where a MOS transistor is to be formed is then oxidized by high temperature oxidzation in dry oxygen, to form a gate oxide film 3 of silicon dioxide. A polycrystalline silicon layer 4 is deposited onto the gate oxide film 3 by chemical vapor deposition (CVD), and resist layer 5 is coated on the polycrystalline silicon layer 5.

Figure 2:
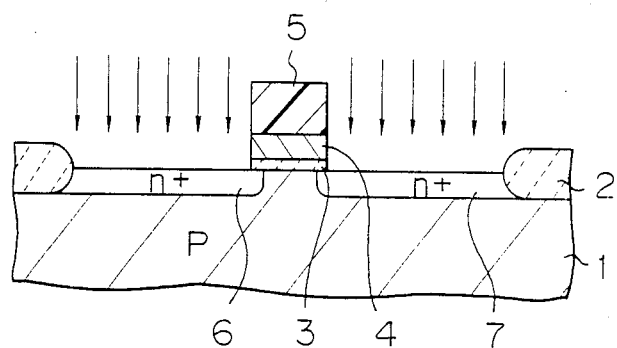

Referring to FIG. 2, the resist layer 5 is patterned in the shape of a gate, and the polysilicon layer 4 and the gate oxide film 3 are patterned to align with the patterned resist layer 5 by etching, to form a gate. Arsenic or phosphorus ions are then selectively implanted into the p-type silicon substrate, using the patterned resist 5 and the field oxide layer 2 as masks, to form an n+-type source region 6 and an n+-type drain region 7. The resist 5 is then removed.

Figure 3:
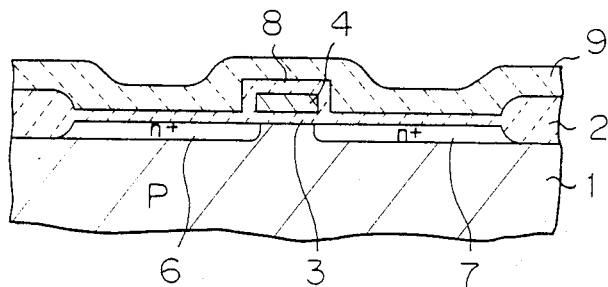

Referring to FIG. 3, the surface of the gate polycrystalline silicon 4 is oxidized (layer 8 in FIG. 3), and a passivation layer 9 of, e.g., phosphosilicate-glass (PSG), is deposited in a thickness of approximately 1.0 μm by CVD.

Figure 4:
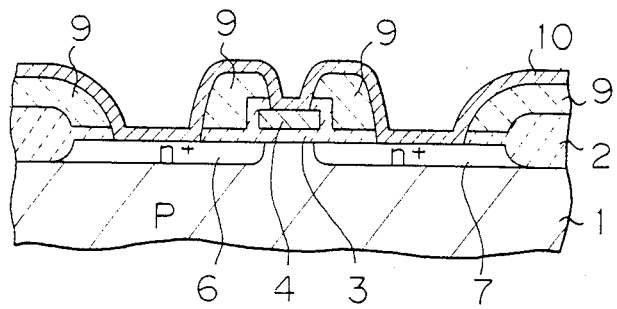

Referring to FIG. 4, the PSG layer 9 is patterned to open source, drain, and gate contact windows by lithography. The patterned PSG layer 9 is then subjected to a melt process, to obtain a gentle slope of the PSG layer 9. A refractory metal, for example, molybdenum, and silicon are then deposited onto the PSG layer 9, and in the source, drain, and gate contact windows, by co-sputtering or hotpress-target-sputtering to form a barrier film 10 having a thickness of from 10 nm to 50 nm, for example, approximately 30 nm. In the co-sputtering process, the deposit rate of molybdenum and silicon is, for example, 3:1, on the basis of the thickness of the deposits when components are individually deposited. Desirably, this process should cause the formation of molybdenum silicide in the deposited film 10, however, this formation is not usually attained. Therefore, at this stage, in accordance with the present invention, the barrier film 10 comprising molybdenum and silicon is beam annealed for a short period of time.

Figure 6:
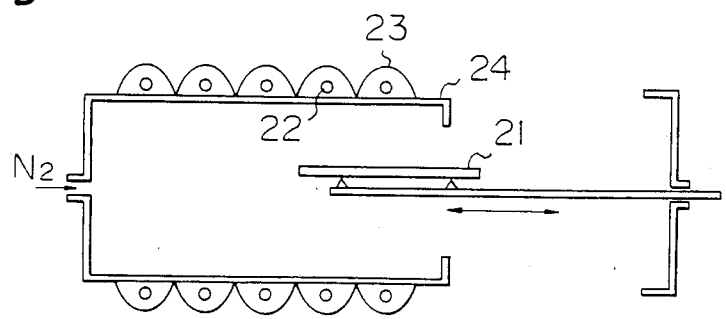
FIG. 6 is a lamp annealing system.

FIG. 6 dipicts an infrared radiation annealing system. In the figure, a silicon substrate or wafer 21 is heated by high power halogen lamps 22 such as chlorine or bromine lamps, which radiate infrared light at a wavelength in the range of from 0.4 μm to 4.0 μm. The infrared light is reflected by parabolic mirrors 23 and passes through a quartz tube 24. The radiation of the thus radiated light is uniform on the wafer 21. The temperature of the wafer is detected by a thermocouple (not shown) and fed back to a power source (not shown) by means of a control unit (not shown). This feed back system enables the temperature of the wafer to be controlled. In this case, the barrier film 10 comprising molybdenum and silicon is annealed in a nitrogen atmosphere at a temperature in the range of 900° C. to 1050° C. for 10 seconds or less. This high-power, high-speed annealing is capable of silicidating the barrier film 10, comprising a refractory metal such as molybdenum and silicon, without causing redistribution of the n+-type diffused regions 6 and 7.

Figure 5:
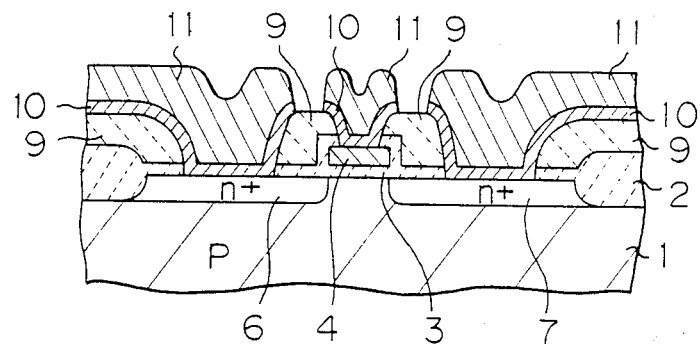

Referring to FIG. 5, an aluminum-silicon alloy (1% silicon) layer 11 is deposited to a thickness of approximately 1 μm and the layers 10 and 11 are selectively etched to produce a desired wiring pattern. The resultant aluminum-silicon-alloy wiring layer 11 has an ohmic contact with the n+-type source and drain regions 6 and 7. The barrier silicide film 10 prevents the epitaxial growth of silicon at the surface of the contact regions, the n+-type source and drain regions 6 and 7, under the aluminum-silicon-alloy wiring layer 11. Further, a silicon phase does not appear in the aluminum-silicon alloy wiring layer 11 even after the device is subjected to heat treatment during the fabrication process, since the barrier film 10 has been changed to a silicide having strong bonds between the molybdenum and silicon.

Tests were carried out on contact regions between a wiring layer and a diffused region in a substrate, the contact regions being formed by various methods according to the prior art and the present invention. These tests were made on the following four types of contact structures:

| Test No. | Wiring Material | Barrier Material | Annealing of Barrier Film |
|---|---|---|---|
| 1 | Al—Si (1% Si) | — | — |
| 2 | Al | Mo + Si | — |
| 3 | Al | Mo + Si | furnace annealing at 900° C. for 20 min |
| 4 | Al | Mo + Si | halogen lamp annealing at 900° C. for 10 sec |

[Notes]
(1) Al—Si: Aluminum-silicon alloy
(2) Al: Pure aluminum
(3) Mo + Si: Co-sputtering of molybdenum and silicon The samples to be tested were obtained by opening several contact windows, having a predetermined shape, in a field oxide layer at the surface of a silicon semiconductor wafer. Arsenic ions were then implanted through the contact windows using the field oxide layer as a mask to form n+-type diffused regions under the contact windows. Next, in the case of test Nos. 2 to 4, a barrier film was formed in the manner described above. The next step was the depositing and patterning of a wiring layer which connected all of the n+-type diffused layers. The patterns of the contact windows and the wiring layer were the same in all samples. Each sample was then subjected to annealing in a nitrogen atmosphere at a temperature of 500° C. for various periods of time. Several samples were prepared for each test. The resistance between the two ends of the wiring layer connecting all the contact regions in each sample, which can be taken to represent the total resistance of the contact regions between the wiring layer and the diffused regions in each sample, was measured as was the annealing time at 500° C.

Figure 7:
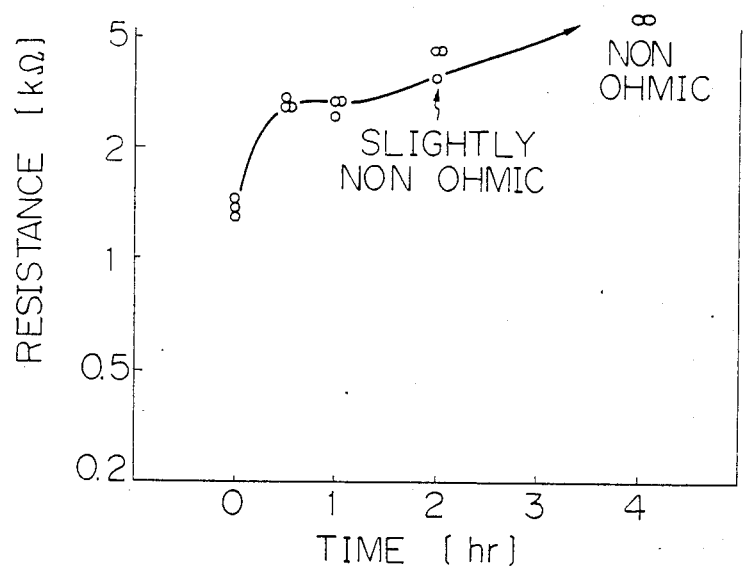
FIGS. 7 to 10 are graphs depicting curves of resistances for various contact regions in relation to annealing time.
Figure 8:
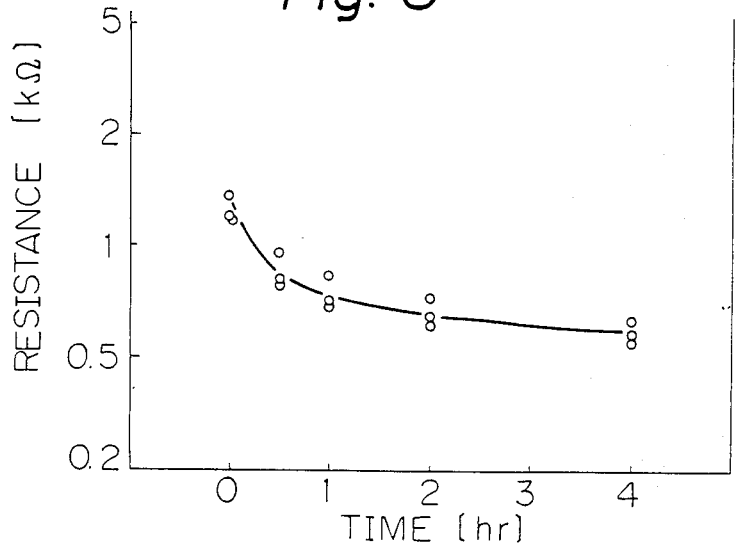
Figure 9:
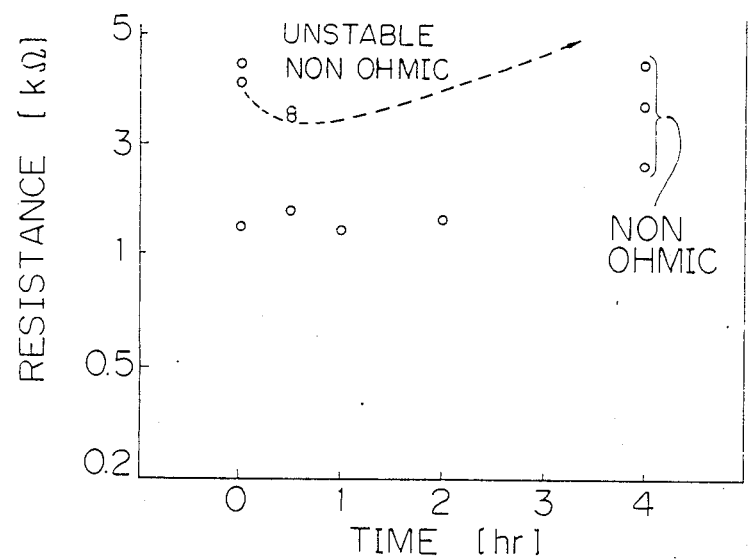
Figure 10:
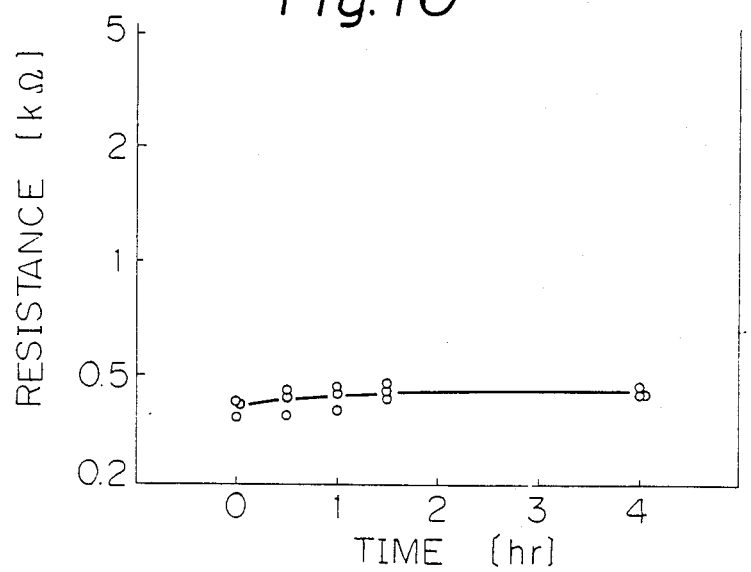

FIGS. 7 to 10 are graphs dipicting the results of test Nos. 1 to 4 corresponding to the above tests, respectively. In FIG. 7, the results of test No. 1 show that the resistances are increased rapidly, and thus a device using this type of contact structure will soon become defective. In FIG. 8, the results of test No. 2 show that the resistances are not increased. It is known, however, that this type of contact structure causes electromigration, resulting in wiring breakage. In FIG. 9, the results of test No. 3, show that the resistances are not constant and are often too high to allow this type of contact structure to be used in the fabrication of a practical device. In FIG. 10, the results of test No. 4, according to the present invention, show that the resistances are very low and are not increased by annealing.

We claim:

1. A process for fabricating a semiconductor device having a doped region containing dopants adjacent a surface of a semiconductor substrate, comprising the steps of:
   (a) forming an insulating layer on the surface of the semiconductor substrate with a contact window above a portion of the doped region;
   (b) depositing a film comprising a refractory metal and silicon on the insulating layer and through the contact window to contact the doped region of the semiconductor substrate and patterning the film;
   (c) beam annealing the film comprising the refractory metal and silicon for a period of time to ensure silicidation of said film into a resultant refractory metal silicide film and to stabilize the contact of the film with the doped region of the semiconductor substrate while avoiding substantial rediffusion of the dopants in the doped region; and
   (d) depositing a wiring layer of one of aluminum and an aluminum alloy onto the resultant refractory metal silicide film to form an electrical or ohmic contact between the wiring layer and the doped region in the semiconductor substrate through the contact window.

2. A process according to claim 1, wherein the semiconductor substrate is silicon.

3. A process according to claim 1, wherein the semiconductor substrate has n-type conductivity under the contact window.

4. A process according to claim 1, wherein the semiconductor substrate has an n-type doped region under the contact window.

5. A process according to claim 1, wherein the contact window has a size smaller than a square measuring 2 μm×2 μm.

6. A process according to claim 1, wherein the refractory metal is selected from molybdenum, tungsten, tantalum and titanium.

7. A process according to claim 6, wherein the refractory metal is molybdenum.

8. A process according to claim 1, wherein said depositing of the film comprising the refractory metal and silicon in step (d) comprises one of co-sputtering and hotpress-target-sputtering of the refractory metal and silicon.

9. A process according to claim 1, wherein the film comprising the refractory metal and silicon is deposited to a thickness of 10 nm to 50 nm.

10. A process according to claim 9, wherein the thickness is approximately 30 nm.

11. A process according to claim 1, wherein said beam annealing in step (c) comprises one of lamp annealing, laser annealing, and electron beam annealing.

12. A process according to claim 11, wherein said beam annealing in step (c) comprises halogen lamp annealing.

13. A process according to claim 1, wherein said beam annealing of the film comprising the refractory metal and silicon is carried out at a temperature of 700° C. to 1100° C. over a time period of less than or equal to one minute.

14. A process according to claim 13, wherein the time period is less than or equal to 20 seconds.

15. A process according to claim 14, wherein the time period is less than or equal to 10 seconds.

16. A process according to claim 15, wherein the time period is less than or equal to 5 seconds.

17. A process according to claim 13, wherein the refractory metal is selected from the group of molybdenum, tungsten and tantalum and said beam annealing is performed at a temperature of 900° C. to 1050° C.

18. A process according to claim 13, wherein the refractory metal is titanium and said beam annealing is performed at a temperature of 800° C. to 1000° C.

19. A process according to claim 7, wherein the resultant refractory metal silicide film is essentially $MoSi_2$.

20. A process according to claim 1, wherein the aluminum alloy is one of aluminum-silicon and aluminum-copper.

21. A process according to claim 20, wherein the aluminum alloy is 1%-silicon aluminum.

22. A process according to claim 1, further comprising the step of patterning the layer of one of aluminum and aluminum-alloy and the resultant refractory metal silicide film to obtain a wiring pattern.

23. A process for fabricating a semiconductor device having a contact window through an insulating layer to a doped region of dopants in a semiconductor substrate, comprising the steps of:
   (a) depositing a film of a refractory metal and silicon on the insulating layer and through the contact window to contact the doped region of the semiconductor substrate; and
   (b) annealing the film using beam annealing for a period of time sufficient to ensure silicidation of the film and to stabilize the contact of the film with the doped region of the semiconductor substrate while avoiding substantial rediffusion of the dopants in the doped region.

24. A process according to claim 23, wherein said beam annealing in step (b) is performed at a temperature between 700° C. and 1100° C. and the period of time is less than approximately one minute.

* * * * *